United States Patent
Eom et al.

(10) Patent No.: US 12,453,989 B2
(45) Date of Patent: Oct. 28, 2025

(54) APPARATUS FOR CLEANING A BACK SIDE OF A SUBSTRATE AND METHOD OF CLEANING A BACK SIDE OF A SUBSTRATE

(71) Applicant: SEMES CO., LTD., Cheonan-si (KR)

(72) Inventors: Sunghun Eom, Cheonan-si (KR); Kangsul Kim, Cheonan-si (KR); Youngjun Son, Cheonan-si (KR); Seongyeol Choi, Cheonan-si (KR)

(73) Assignee: SEMES CO., LTD., Chungcheongnam-do (KR)

( * ) Notice: Subject to any disclaimer, the term of this patent is extended or adjusted under 35 U.S.C. 154(b) by 0 days.

(21) Appl. No.: 18/328,203

(22) Filed: Jun. 2, 2023

(65) Prior Publication Data
US 2023/0415207 A1   Dec. 28, 2023

(30) Foreign Application Priority Data
Jun. 22, 2022   (KR) .......................... 10-2022-0076431

(51) Int. Cl.
*B08B 3/12*   (2006.01)
*H01L 21/02*   (2006.01)
*H01L 21/67*   (2006.01)

(52) U.S. Cl.
CPC .......... *B08B 3/12* (2013.01); *H01L 21/02052* (2013.01); *H01L 21/67057* (2013.01)

(58) Field of Classification Search
CPC .. B08B 3/12; H01L 21/02052; H01L 21/0209
See application file for complete search history.

(56) References Cited

U.S. PATENT DOCUMENTS

| | | | |
|---|---|---|---|
| 11,660,643 B2 | 5/2023 | Ishibashi | |
| 2004/0221877 A1* | 11/2004 | Bergman | B08B 3/02 257/E21.228 |
| 2006/0027248 A1* | 2/2006 | Lewis | H01L 21/02052 134/1 |
| 2020/0126822 A1* | 4/2020 | Kanematsu | H01L 21/68792 |

FOREIGN PATENT DOCUMENTS

| | | | |
|---|---|---|---|
| JP | 09321010 A | * | 12/1997 |
| JP | H11-260778 A | | 9/1999 |
| JP | 2021-185602 A | | 12/2021 |
| KR | 10-0766460 B1 | | 10/2007 |
| KR | 10-2009-0035097 A | | 4/2009 |
| KR | 10-2011-0062026 A | | 6/2011 |
| KR | 10-1677839 B1 | | 3/2016 |

OTHER PUBLICATIONS

Machine translation: JP09321010; Matsuzaki, N. (Year: 1997).*

* cited by examiner

*Primary Examiner* — Natasha N Campbell
(74) *Attorney, Agent, or Firm* — Harness, Dickey & Pierce, P.L.C.

(57) ABSTRACT

An apparatus for cleaning a back side of a substrate may include a cleaning assembly which may include a cleaning solution supply part receiving a cleaning solution and an ultrasonic wave supply part applying an ultrasonic wave to the cleaning solution such that a column of the cleaning solution is formed from the cleaning solution supply part toward the back side of the substrate. The back side of the substrate may be cleaned by contacting the column of the cleaning solution with the back side of the substrate.

14 Claims, 3 Drawing Sheets

APPARATUS FOR CLEANING A BACK SIDE OF A SUBSTRATE AND METHOD OF CLEANING A BACK SIDE OF A SUBSTRATE

CROSS-REFERENCE TO RELATED APPLICATION

This application claims priority to Korean Patent Application No. 10-2022-0076431 filed on Jun. 22, 2022 in the Korean Intellectual Property Office (KIPO), the contents of which are herein incorporated by reference in its entirety.

FIELD

Example embodiments of the invention relate to an apparatus for cleaning a back side of a substrate and a method of cleaning a back side of a substrate. More particularly, example embodiments of the invention relate to an apparatus for cleaning a back side of a substrate capable of contacting a column of a cleaning solution with the back side of the substrate when the back side of the substrate is cleaned, and a method of cleaning a back side of a substrate using such apparatus for cleaning a back side of a substrate.

RELATED TECHNOLOGY

As an integrated circuit device such as a semiconductor device or a display device becomes minute, processes for manufacturing the integrated circuit device are more complicated. It is required to substantially completely remove impurities including particles from a substrate in the process for manufacturing the recent integrated circuit device. In this case, the impurities should be removed the front side of the substrate as well as the impurities must be removed from the back side of the substrate.

The conventional cleaning process using a cleaning solution may fully remove the impurities from the front side of the substrate, however, such as cleaning process may not completely remove the impurities from the back side of the substrate.

SUMMARY

One aspect of the invention is related to an apparatus for cleaning a back side of a substrate capable of more effectively cleaning the back side of the substrate.

Another aspect of the invention is related to a method of cleaning a back side of a substrate capable of more effectively cleaning the back side of the substrate.

According to an aspect of the invention, there is provided an apparatus for cleaning a back side of a substrate. The apparatus for cleaning a back side of a substrate may include a cleaning assembly. The cleaning assembly may include a cleaning solution supply part receiving a cleaning solution and an ultrasonic wave supply part applying an ultrasonic wave to the cleaning solution such that a column of the cleaning solution is formed from the cleaning solution supply part toward the back side of the substrate. The back side of the substrate may be cleaned by contacting the column of the cleaning solution with the back side of the substrate In example embodiments, the cleaning solution supply part may include a bath and the ultrasonic wave supply part may apply the ultrasonic wave from a bottom of the bath toward a top of the bath.

In some example embodiments, the apparatus for cleaning a back side of a substrate may include a first cleaning assembly and a second cleaning assembly symmetrically disposed under the substrate.

In some example embodiments, the first cleaning assembly may include a first ultrasonic wave supply part generating a first ultrasonic wave having a first frequency to remove impurities having a first size from the back side of the substrate, and the second cleaning assembly may include a second ultrasonic wave supply part generating a second ultrasonic wave having a second frequency to remove impurities having a second size smaller than the first size from the back side of the substrate.

In some example embodiments, the first cleaning assembly may include a first cleaning solution supply part and the second cleaning assembly may include a second cleaning solution supply part. The first ultrasonic wave supply part may form the column of the cleaning solution from the first cleaning solution supply part toward the back side of the substrate and the second ultrasonic wave supply part may form the column of the cleaning solution from the second cleaning solution supply part toward the back side of the substrate In some example embodiments, the first ultrasonic wave supply part may generate the first ultrasonic wave having a first variable frequency and the second ultrasonic wave supply part may generate the second ultrasonic wave having a second variable frequency.

In example embodiments, the apparatus for cleaning a back side of a substrate may additionally include a part for rotating a substrate and a positioning part adjusting a height of the cleaning assembly. The part for rotating a substrate may rotate the substrate, the ultrasonic wave supply part may generate the ultrasonic wave and the positioning part may contact the column of the cleaning solution with the back side of the substrate when the back side of the substrate is cleaned. The ultrasonic wave supply part may not operate and the part for rotating a substrate may rotate the substrate when the back side of the substrate is dried.

In example embodiments, the part for rotating a substrate may support a central portion of the back side of the substrate.

According to another aspect of the invention, there is provided an apparatus for cleaning a back side of a substrate. The apparatus for cleaning a back side of a substrate may include a part for rotating a substrate supporting a central portion of the back side of the substrate and rotating the substrate. The apparatus for cleaning a back side of a substrate may include a cleaning assembly. The cleaning assembly may include a cleaning solution supply part receiving a cleaning solution and an ultrasonic wave supply part applying an ultrasonic wave to the cleaning solution such that a column of the cleaning solution is formed from the cleaning solution supply part toward the back side of the substrate, The apparatus for cleaning a back side of a substrate may include a positioning part adjusting a height of the cleaning assembly such that the column of the cleaning solution contacts the back side of the substrate.

In example embodiments, the cleaning solution supply part may include a bath and the ultrasonic wave supply part may apply the ultrasonic wave from a bottom of the bath toward a top of the bath.

In some example embodiments, the apparatus for cleaning a back side of a substrate may include a first cleaning assembly and a second cleaning assembly symmetrically disposed under the substrate.

In some example embodiments, the first cleaning assembly may include a first ultrasonic wave supply part generating a first ultrasonic wave having a first frequency to remove impurities having a first size from the back side of the substrate, and the second cleaning assembly may include a second ultrasonic wave supply part generating a second ultrasonic wave having a second frequency to remove impurities having a second size smaller than the first size from the back side of the substrate.

In some example embodiments, the first cleaning assembly may include a first cleaning solution supply part and the second cleaning assembly may include a second cleaning solution supply part. The first ultrasonic wave supply part may form the column of the cleaning solution from the first cleaning solution supply part toward the back side of the substrate and the second ultrasonic wave supply part may form the column of the cleaning solution from the second cleaning solution supply part toward the back side of the substrate In example embodiments, the part for rotating a substrate may rotate the substrate, the ultrasonic wave supply part may generate the ultrasonic wave and the positioning part may contact the column of the cleaning solution with the back side of the substrate when the back side of the substrate is cleaned. The ultrasonic wave supply part may not operate and the part for rotating a substrate rotates the substrate when the back side of the substrate is dried.

According to still another aspect of the invention, there is provided a method of cleaning a back side of a substrate. The method of cleaning a back side of a substrate may include providing a cleaning solution, forming a column of the cleaning solution by applying an ultrasonic wave to the cleaning solution, and cleaning the back side of the substrate by contacting the column of the cleaning solution with the back side of the substrate.

In example embodiments, the ultrasonic wave may be applied from a bottom of the cleaning solution toward a top of the cleaning solution.

In some example embodiments, the forming the column of the cleaning solution may include forming two columns of the cleaning solution centering around a central portion of the back side of the substrate.

In some example embodiments, one of the columns of the cleaning solution may be formed by applying a first ultrasonic wave having a first frequency to the cleaning solution and the other of the columns of the cleaning solution may be formed by applying a second ultrasonic wave having a second frequency to the cleaning solution. The column of the cleaning solution formed by the first ultrasonic wave may remove impurities having a first size from the back side of the substrate and the column of the cleaning solution formed by the second ultrasonic wave may remove impurities having a second size smaller than the first size from the back side of the substrate.

In example embodiments, the method of cleaning a back side of a substrate may additionally include rotating the substrate. The substrate may be rotated and the column of the cleaning solution may be contacted with the back side of the substrate when the back side of the substrate is cleaned. The substrate may be rotated and the column of the cleaning solution may be separated from the back side of the substrate when the back side of the substrate is dried.

In example embodiments, the cleaning of the back side of the substrate may include adjusting a position of the column of the cleaning solution to contact the column of the cleaning solution with the back side of the substrate.

According to example embodiments, the apparatus for cleaning a back side of a substrate may more effectively clean the back side of the substrate using the column of the cleaning solution. By the apparatus for cleaning a back side of a substrate, the failure of the semiconductor device may be reduced and the reliability of the semiconductor device may be improved.

BRIEF DESCRIPTION OF THE DRAWINGS

Example embodiments will be more clearly understood from the following detailed description taken in conjunction with the accompanying drawing. The following figures represent non-limiting, example embodiments as described herein.

DESCRIPTION OF EMBODIMENTS

Figure 1:
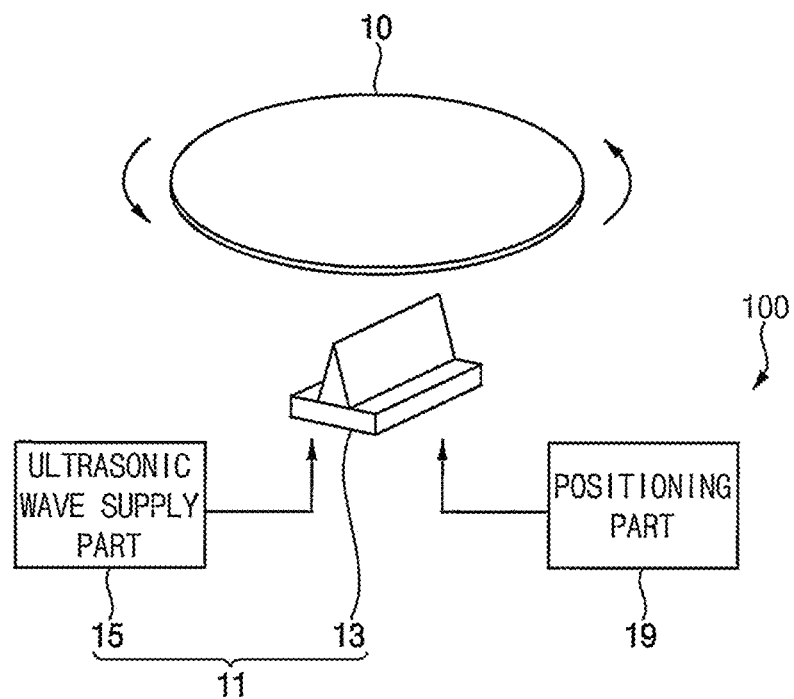
FIG. 1 is a diagram schematically illustrating an apparatus for cleaning a back side of a substrate in accordance with example embodiments of the invention.

Various embodiments will be described more fully hereinafter with reference to the accompanying drawings, in which some embodiments are shown. The invention may, however, be embodied in many different forms and should not be construed as limited to the embodiments set forth herein. Rather, these embodiments are provided so that this description will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (for example, rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the face through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
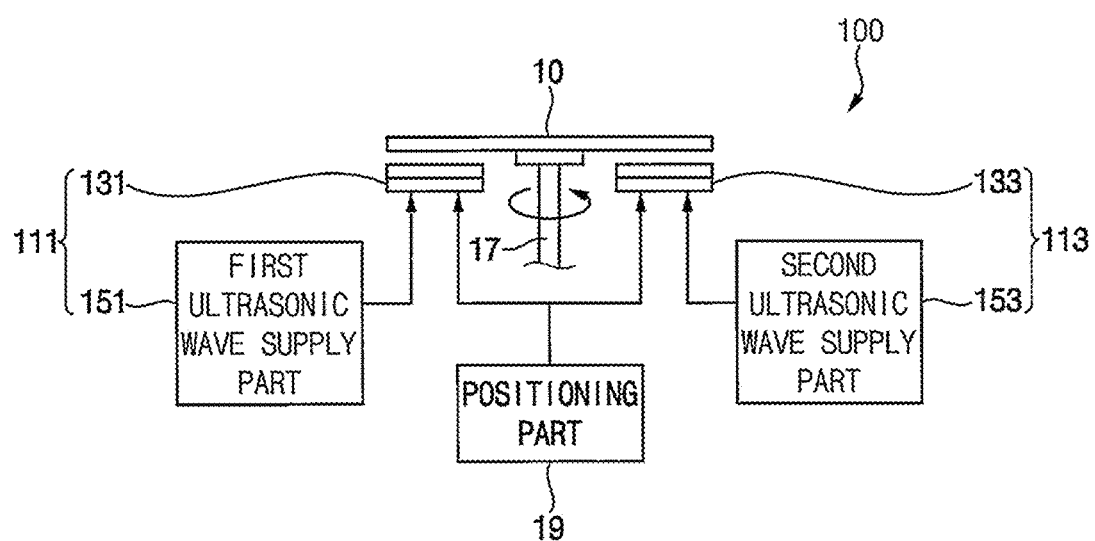
FIGS. 2 and 3 are diagram s schematically illustrating an apparatus for cleaning a back side of a substrate in accordance with some example embodiments of the invention.
Figure 3:
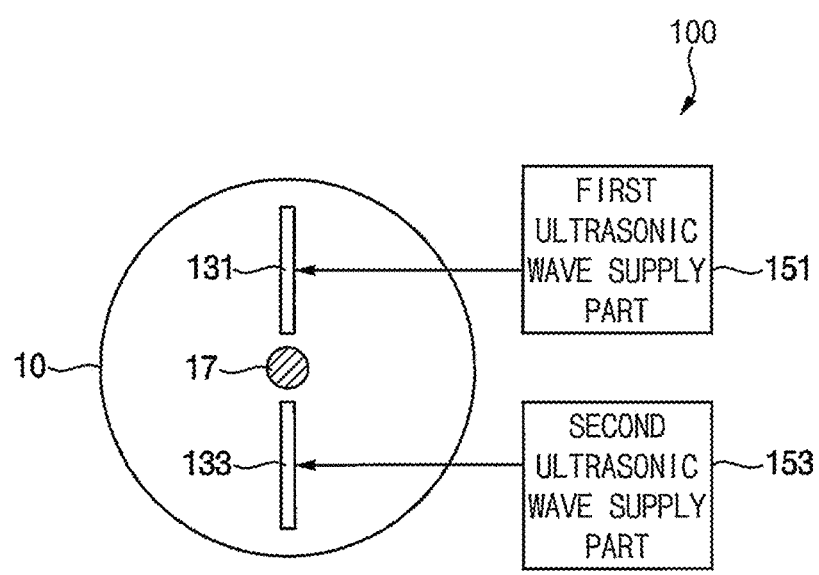

FIG. 1 is a diagram schematically illustrating an apparatus for cleaning a back side of a substrate in accordance with example embodiments of the invention. FIGS. 2 and 3 are diagrams schematically illustrating an apparatus for cleaning a back side of a substrate in accordance with some example embodiments of the invention.

Referring to FIG. 1 to FIG. 3, an apparatus for cleaning a back side of a substrate 100 according to example embodiments may clean a real face or a back side of a substrate 10 for manufacturing integrated circuit devices such as semiconductor devices or display devices. For example, the apparatus for cleaning a back side of a substrate 100 may be used to clean a back side of a wafer in semiconductor manufacturing processes.

In example embodiments, the apparatus for cleaning a back side of a substrate 100 may include a cleaning assembly 11, a part for rotating a substrate 17 and a positioning part 19.

As illustrated in FIG. 1, the cleaning assembly 11 may include a cleaning solution supply part 13 and an ultrasonic wave supply part 15. The cleaning solution supply part 13 may receive a predetermined cleaning solution and may provide such cleaning solution onto the back side (i.e., the real face) of the substrate 10. The ultrasonic wave supply part 15 may provide an ultrasonic wave having to a predetermined frequency band to the cleaning solution supply part 13.

The apparatus for cleaning a back side of a substrate 100 according to example embodiments, the ultrasonic wave having an adjustable frequency band may be applied to the cleaning solution supply part 13 from the ultrasonic wave supply part 15, and thus the cleaning solution may be effectively provided onto the back side of the substrate 10 from the cleaning solution supply part 13. Particularly, by controlling the frequency band of the ultrasonic wave, the cleaning solution having a substantial column shape may be provided onto the back side of the substrate 10 from the cleaning solution supply part 13 in accordance with the straightness and/or diffraction properties of the ultrasonic wave. In other words, the straightness and/or diffraction properties of the ultrasonic wave may be advantageously controlled by adjusting the frequency band of ultrasonic wave such that the substantial column of the cleaning solution may be generated from the cleaning solution supply part 13 toward the back side of the substrate 10. Therefore, the column of the cleaning solution may contact the back side of the substrate 10 and may effectively clean the back side of the substrate 10.

In example embodiments, the apparatus for cleaning a back side of a substrate 100 may advantageously clean the back side of the substrate 10 using the column of the cleaning solution without immersing the substrate 10 into the cleaning solution or spraying the cleaning solution onto the back side of the substrate 10 with relatively high pressure. If the substrate 10 is immersed into the cleaning solution or the cleaning solution is sprayed onto the back side of the substrate 10 with the relatively high pressure, the cleaning solution may be partially remain on a front side of the substrate 10, which may cause the failure of the integrated circuit device. According to example embodiments, the column of the cleaning solution may make contact with the back side of the substrate 10 only so that the back side of the substrate 10 may be effectively cleaned while preventing the cleaning solution being partially remained on the front side of the substrate 10. Therefore, the apparatus for cleaning a back side of a substrate 100 may reduce the failure of the integrated circuit device.

In some example embodiments, the apparatus for cleaning a back side of a substrate 100 may simultaneously apply the ultrasonic wave to the back side of the substrate 10 from the ultrasonic wave supply part 15 while the column of the cleaning solution from the cleaning solution supply part 13 contacts the back side of the substrate 10. That is, the apparatus for cleaning a back side of a substrate 100 may clean the back side of the substrate 10 simultaneously using the column of the cleaning solution and the ultrasonic wave. Accordingly, the back side of the substrate 10 may much effectively cleaned using the apparatus for cleaning a back side of a substrate 100.

In a process for cleaning the back side of the substrate 10 using the apparatus for cleaning a back side of a substrate 100, the column of the cleaning solution may shake in a left direction and/or a right direction relative to the back side of the substrate 10 while moving the column of the cleaning solution along the back side of the substrate 10. In this case, the efficiency of cleaning the back side of the substrate 10 by the cleaning solution may be relatively decreased.

In example embodiments, the apparatus for cleaning a back side of a substrate 100 may make the column of the cleaning solution contacting a desired portion of the back side of the substrate 10 without shaking in the left direction and/or the right direction while the back side of the substrate 10 is cleaned using the column of the cleaning solution.

Hereinafter, the cleaning assembly according to example embodiments will be described in detail.

Figure 4:
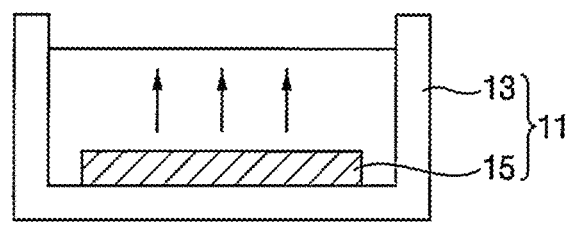
FIGS. 4 and 5 are cross-sectional views schematically illustrating a cleaning assembly of an apparatus for cleaning a back side of a substrate in accordance with example embodiments of the invention.
Figure 5:
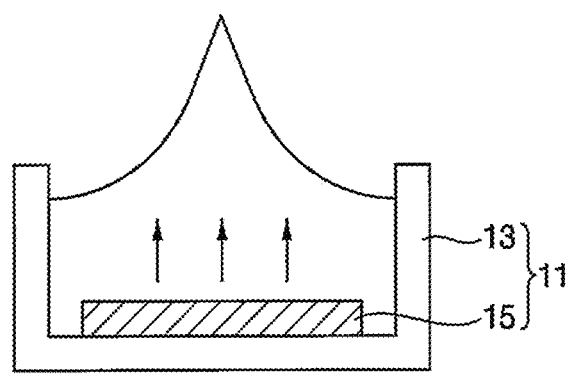

FIG. 4 and FIG. 5 are cross-sectional views schematically illustrating the cleaning assembly 11 of the apparatus for cleaning a back side of a substrate 100 in accordance with example embodiments of the invention.

The conventional cleaning assembly has a configuration in which a cleaning solution flows onto a back side of a substrate from a cleaning solution supply part such that a column of the cleaning solution may not be formed at a desired portion relative to the back side of the substrate even though a ultrasonic wave is applied to such cleaning solution so as to form the column of the cleaning solution.

Referring FIGS. 4 and 5, the cleaning assembly 11 according to example embodiments may include the cleaning solution supply part 13 for receiving the cleaning solution therein. For example, example, the cleaning solution supply part 13 may include a bath for relatively easily forming the column of the cleaning solution.

In example embodiments, the column of the cleaning solution may extend from the cleaning solution supply part 13 toward the back side of the substrate 10. To this end, the ultrasonic wave supply part 15 may apply the ultrasonic wave to the cleaning solution in the cleaning solution supply part 13 along a direction from a lower portion of the cleaning solution supply part 13 toward an upper portion of the cleaning solution supply part 13. For example, the ultrasonic wave supply part 15 may provide the ultrasonic wave to the cleaning solution in the bath along a direction from a bottom of the bath toward a top of the bath. In other words, by applying the ultrasonic wave from the ultrasonic wave supply part 15 to the cleaning solution in the cleaning solution supply part 13, the column of the cleaning solution may rise from the cleaning solution supply part 13 toward the back side of the substrate 10. Here, by controlling the straightness and/or diffraction properties of the ultrasonic wave, the column of the cleaning solution may be advantageously generated and then may contact the desired portion of the back side of the substrate 10. Therefore, the efficiency of cleaning the back side of the substrate 10 may be improved using the column of the cleaning solution.

Referring now FIG. 1 to FIG. 3, the substrate 10 may be substantially disposed in the apparatus for cleaning a back side of a substrate 100. For example, the substrate 10 may be placed on a supporting part (not illustrated) in the apparatus for cleaning a back side of a substrate 100. In this case, the cleaning assembly 11 may be disposed under the substrate 10. For example, the cleaning assembly 11 may be located substantially perpendicular to the back side of the substrate 10.

In example embodiments, the positioning part 19 may adjust the position of the cleaning assembly 11. For example, the positioning part 19 may make the cleaning assembly 11 to move upwardly and/or move downwardly under the substrate 10. The column of the cleaning solution extended from cleaning solution supply part 13 may make contact with the back side of the substrate 10 by the positioning part 19. For example, the positioning part 19 may have a cylinder structure for moving the cleaning assembly 11 in an upward direction or a downward direction under the substrate 10. In this case, the positioning part 19 may include a linear motor for the reciprocating motion of the cylinder structure. By using the positioning part 19 and the cleaning assembly 11, the back side of the substrate 10 may be more effectively cleaned by the column of the cleaning solution.

In some example embodiments, the substrate 10 may rotate such that the column of the cleaning solution produced from the cleaning solution supply part 13 may more effectively clean the entire back side of the substrate 10. In other example embodiments, the cleaning assembly 11 may move in all directions under the substrate 10 to more enhance the efficiency of cleaning the back side of the substrate 10. In still other example embodiments, the cleaning assembly 11 may move in all directions under the substrate 10 while the substrate 10 rotates so as to maximize the efficiency of cleaning the back side of the substrate 10.

In example embodiments, the part for rotating a substrate 17 may support a central portion of the back side of the substrate 10. The part for rotating a substrate 17 may include a supporting member for holding the central portion of the back side of the substrate 10 and a rotating member for rotating the substrate 10. For example, the supporting member may support the central portion of the back side of the substrate 10 in a vacuum suction manner and the rotating member may include a rotary motor for rotating the substrate 10 at a predetermined speed.

In some example embodiments, as illustrated in FIGS. 2 and 3, the apparatus for cleaning a back side of a substrate 100 may include a first cleaning assembly 111 and a second cleaning assembly 113, which may be disposed under both sides of the back side of the substrate 10, respectively, as illustrated in FIG. 2. The first cleaning assembly 111 and the second cleaning assembly 113 may be substantially symmetrically disposed centering around the central portion of the back side of the substrate 10. For example, each of the first cleaning assembly 111 and the second cleaning assembly 113 may have a substantial bar shape extending from the central portion of the back side of the substrate 10 to a periphery portion of the back side of the substrate 10. In this case, the first cleaning assembly 111 and the second cleaning assembly 113 may simultaneously or sequentially clean the back side of the substrate 10.

In some example embodiments, the first cleaning assembly 111 and the second cleaning assembly 113 may be disposed by an interval of about 180 degrees under the substrate 10 when each of the first cleaning assembly 111 and the second cleaning assembly 113 has the substantial bar shape. In other example embodiments, the apparatus for cleaning a back side of a substrate 100 may include four cleaning assemblies disposed under the substrate 10 by intervals of about 90 degrees. In still example embodiments, the apparatus for cleaning a back side of a substrate 100 may include six cleaning assemblies disposed under the substrate 10 by intervals of about 60 degrees, however, the invention cannot be limited thereto. When the apparatus for cleaning a back side of a substrate 100 includes a plurality of cleaning assemblies, the plurality of cleaning assemblies may be arranged under the substrate 10 by substantially equal intervals.

When the apparatus for cleaning a back side of a substrate 100 includes the first cleaning assembly 111 and the second cleaning assembly 113, two ultrasonic waves having different frequency bands may be applied to the cleaning solution. The first cleaning assembly 111 may include a first cleaning solution supply part 131 and a first ultrasonic wave supply part 151, and the second cleaning assembly 113 may include a second cleaning solution supply part 133 and a second ultrasonic wave supply part 153.

In example embodiments, the first ultrasonic wave supply part 151 may apply a first ultrasonic wave having a first frequency band to the cleaning solution received the first cleaning solution supply part 131 such that impurities having a first size may be removed from the back side of the substrate 10. Additionally, the second ultrasonic wave supply part 153 may apply a second ultrasonic wave having a second frequency band to the cleaning solution received the second cleaning solution supply part 133 so that impurities having a second size may be removed from the back side of the substrate 10. Here, the second size may be substantially smaller than the first size. For example, the first ultrasonic wave may be applied to the cleaning solution from the first ultrasonic wave supply part 151 to remove the impurities having an average size greater than about 2 micrometers from the back side of the substrate 10. In addition, the second ultrasonic wave may be applied to the cleaning solution from the second ultrasonic wave supply part 153 to remove the impurities having an average size less than about 2 micrometers from the back side of the substrate 10.

If each of the first and the second ultrasonic waves generated from each of the first and the second ultrasonic wave supply parts 151 and 153 has a standing wave form, the impurities having the first and the second sizes may not be effectively cleaned from the back side of the substrate 10. To more effectively clean the impurities, the first ultrasonic wave supply part 151 may generate the first ultrasonic wave having a first variable frequency and/or the second ultrasonic wave supply part 153 may generate the second ultrasonic wave having a second variable frequency. For example, the first variable frequency may be in a range between about 200 KHz and about 400 KHz and the second variable frequency may be in a range between about 0.4 MHz and about 1.2 MHz. The first variable frequency may correspond to a low frequency and the second variable frequency may correspond to a high frequency.

As described above, the first ultrasonic wave supply part 151 may apply the first ultrasonic wave of the first variable frequency to from the column of the cleaning solution and/or the second ultrasonic wave supply part 153 may apply the second ultrasonic wave of the second variable frequency to from the column of the cleaning solution. Accordingly, the impurities having various sizes may be efficiently removed from the back side of the substrate 10.

In some example embodiments, the first cleaning solution supply part 131 may have a structure substantially identical to that of the second cleaning solution supply part 133. For example, each of the first and the second cleaning solution supply parts 131 and 133 may have a bar structure extending from the central portion of the back side of the substrate 10 to the peripheral portion of the back side of the substrate 10. At this time, the first cleaning solution supply part 131 and the second cleaning solution supply part 133 may be symmetrically disposed under the substrate 10.

The apparatus for cleaning a back side of a substrate 100 including the first and the second cleaning assemblies 111 and 113 may much effectively clean the back side of the substrate 10 compared to the conventional apparatus for cleaning a back side of a substrate. Therefore, the failure of the integrated circuit device manufactured using apparatus for cleaning a back side of a substrate 100 may be recurred and the reliability of the integrated circuit device may be improved.

In other example embodiments, the apparatus for cleaning a back side of a substrate 100 may perform a drying process on the back side of the substrate 10 after performing the cleaning process on the back side of the substrate 10. More specifically, the part for rotating a substrate 17 and the ultrasonic wave supply part 15 may simultaneously operate when the back side of the substrate 10 is cleaned. When the back side of the substrate 10 is dried, the ultrasonic wave supply part 15 may not operate while the part for rotating a substrate 17 may operate to rotate the substrate 10. The cleaning solution remained on the back side of the substrate 10 may be removed in accordance with such rotation of the substrate 10.

Similarly, in some example embodiments, the part for rotating a substrate 17, the first ultrasonic wave supply part 151 and the second ultrasonic wave supply part 153 may operate when the back side of the substrate 10 is cleaned. Additionally, the first ultrasonic wave supply part 151 and the second ultrasonic wave supply part 153 may not operate whereas the part for rotating a substrate 17 may operate to rotate the substrate 10.

In other example embodiments, to dry the back side of the substrate 10, the part for rotating a substrate 17 may continuously operate and the positioning part 19 may sufficiently separate the cleaning assembly 11 from the back side of the substrate 10. Hence, the back side of the substrate 10 may be dried by the rotation of the substrate 10 without contacting the column of the cleaning solution.

The apparatus for cleaning a back side of a substrate 100 may perform both of the cleaning process and the drying process about the substrate 10 so that the process time for manufacturing the integrated circuit device may be decreased and also the entire facility including the apparatus for cleaning a back side of a substrate 100 may be reduced.

Hereinafter, it will be described a method of cleaning a back side of a substrate using an apparatus for cleaning a back side of a substrate in accordance with example embodiments.

The substrate 10 to be cleaned may be loaded in the apparatus for cleaning a back side of a substrate 100. At that time, the central portion of the back side of the substrate 10 may be supported by the part for rotating a substrate 17.

The cleaning solution may be supplied into the cleaning solution supply part 13 of the cleaning assembly 11 disposed under the substrate 10. A predetermined amount of the cleaning solution may be received in the cleaning solution supply part 13.

The ultrasonic wave may be applied from the ultrasonic wave supply part 15 to the cleaning solution in the cleaning solution supply part 13. Thus, the column of the cleaning solution may be formed from the cleaning solution supply part 13 toward the back side of the substrate 10, as described above.

The column of the cleaning solution may contact the back side of the substrate 10 using the positioning part 19, and then the back side of the substrate 10 may be cleaned by the column of the cleaning solution.

In some example embodiments, the apparatus for cleaning a back side of a substrate 100 may include the first and the second cleaning assemblies 111 and 113 substantially symmetrically disposed under the substrate 10. In this case, as described above, the cleaning solution may be provided into the first and the second cleaning solution supply parts 131 and 133. Further, the first and the second ultrasonic waves may be applied to the cleaning solution in the first and the second cleaning solution supply parts 131 and 133 from the first and the second ultrasonic wave supply parts 151 and 153, respectively. Therefore, the columns of the cleaning solution may be extended from the first and the second ultrasonic wave supply parts 151 and 153 toward the back side of the substrate 10. Here, the first ultrasonic wave having the first frequency band may be applied from the first ultrasonic wave supply part 151 to the cleaning solution in the first cleaning solution supply part 131 and the second ultrasonic wave having the second frequency band may be applied from the second ultrasonic wave supply part 153 to the cleaning solution in the second cleaning solution supply part 133. The columns of the cleaning solution may make contact with the back side of the substrate 10 using the positioning part 19, and the back side of the substrate 10 may be cleaned by the columns of the cleaning solution.

In other example embodiments, the back side of the substrate 10 may be cleaned by a plurality of columns of the cleaning solution formed by a plurality of ultrasonic wave supply parts (e.g., three, four, or more ultrasonic wave supply parts).

As described above, the back side of the substrate 10 may be dried using the apparatus for cleaning a back side of a substrate 100 after cleaning the back side of the substrate 10.

According to example embodiments of the invention, the apparatus for cleaning a back side of a substrate may be advantageously used in various processes for manufacturing the integrated circuit device, particularly the semiconductor device. By using the apparatus for cleaning a back side of a substrate, the failure of the semiconductor device may be reduced and the reliability of the semiconductor device may be improved.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. An apparatus for cleaning a back side of a substrate comprising:
    at least one cleaning assembly, the at least one cleaning assembly comprising:
    a cleaning solution supply part configured to receive a cleaning solution; and
    an ultrasonic wave supply part configured to supply an ultrasonic wave to the cleaning solution such that a column of the cleaning solution is formed from the cleaning solution supply part toward the back side of the substrate,
    wherein the back side of the substrate is configured to be cleaned by contacting the column of the cleaning solution with the back side of the substrate,
    the column of the cleaning solution is configured to contact the back side of the substrate without spraying or applying high pressure to form the column of the cleaning solution,
    the at least one cleaning assembly comprises a first cleaning assembly and a second cleaning assembly symmetrically disposed under the substrate,
    the first cleaning assembly includes
        a first ultrasonic wave supply part configured to generate a first ultrasonic wave having a first frequency to remove impurities having a first size from the back side of the substrate, and
    the second cleaning assembly includes a second ultrasonic wave supply part configured to generate a second ultrasonic wave having a second frequency to remove impurities having a second size smaller than the first size from the back side of the substrate,
    the first frequency is greater than or equal to 200 KHz and less than or equal to 400 KHz, and
    the second frequency is greater than or equal to 0.4 MHz and less than or equal to 1.2 MHz.

2. The apparatus claim 1, wherein
    the first cleaning assembly includes a first cleaning solution supply part and the second cleaning assembly includes a second cleaning solution supply part, and
    the first ultrasonic wave supply part forms the column of the cleaning solution from the first cleaning solution supply part toward the back side of the substrate and the second ultrasonic wave supply part forms the column of the cleaning solution from the second cleaning solution supply part toward the back side of the substrate.

3. The apparatus of claim 1, wherein the first ultrasonic wave supply part is configured to generate the first ultrasonic wave having a first variable frequency and the second ultrasonic wave supply part is configured to generate the second ultrasonic wave having a second variable frequency.

4. The apparatus of claim 1, further comprising:
    a part configured to rotate the substrate; and
    a positioning part configured to adjust a height of the at least one cleaning assembly,
    wherein the part configured to rotate the substrate is configured to rotate the substrate, the ultrasonic wave supply part is configured to generate the ultrasonic wave and the positioning part contacts the column of the cleaning solution with the back side of the substrate in response to the back side of the substrate being cleaned, and
    wherein the ultrasonic wave supply part does not operate and the part for rotating the substrate rotates the substrate in response to the back side of the substrate being dried.

5. The apparatus of claim 4, wherein the part configured to rotate the substrate is configured to support a central portion of the back side of the substrate.

6. An apparatus for cleaning a back side of a substrate comprising:
    at least one cleaning assembly, the at least one cleaning assembly comprising:
    a cleaning solution supply part configured to receive a cleaning solution; and
    an ultrasonic wave supply part configured to supply an ultrasonic wave to the cleaning solution such that a column of the cleaning solution is formed from the cleaning solution supply part toward the back side of the substrate, wherein the back side of the substrate is configured to be cleaned by contacting the column of the cleaning solution with the back side of the substrate, wherein the cleaning solution supply part includes a bath and the ultrasonic wave supply part is configured to apply the ultrasonic wave from a bottom of the bath toward a top of the bath, the at least one cleaning assembly comprises a first cleaning assembly and a second cleaning assembly symmetrically disposed under the substrate, the first cleaning assembly includes
- a first ultrasonic wave supply part configured to generate a first ultrasonic wave having a first frequency to remove impurities having a first size from the back side of the substrate, and
- the second cleaning assembly includes a second ultrasonic wave supply part configured to generate a second ultrasonic wave having a second frequency to remove impurities having a second size smaller than the first size from the back side of the substrate, the first frequency is greater than or equal to 200 KHz and less than or equal to 400 KHz, and the second frequency is greater than or equal to 0.4 MHz and less than or equal to 1.2 MHz.

7. The apparatus of claim 6, wherein
the first cleaning assembly includes a first cleaning solution supply part and the second cleaning assembly includes a second cleaning solution supply part, and
the first ultrasonic wave supply part forms the column of the cleaning solution from the first cleaning solution supply part toward the back side of the substrate and the second ultrasonic wave supply part forms the column of the cleaning solution from the second cleaning solution supply part toward the back side of the substrate.

8. The apparatus of claim 6, wherein the first ultrasonic wave supply part is configured to generate the first ultrasonic wave having a first variable frequency and the second ultrasonic wave supply part is configured to generate the second ultrasonic wave having a second variable frequency.

9. The apparatus of claim 6, further comprising:
a part configured to rotate the substrate; and
a positioning part configured to adjust a height of the at least one cleaning assembly,
wherein
the part configured to rotate the substrate is configured to rotate the substrate,
the ultrasonic wave supply part is configured to generate the ultrasonic wave, and
the positioning part is configured to move the at least one cleaning assembly upward during a back side cleaning operation such that the column of the cleaning solution contacts the back side of the substrate during the back side cleaning operation, and
wherein the ultrasonic wave supply part does not operate and the part for rotating the substrate rotates the substrate in response to the back side of the substrate being dried.

10. The apparatus of claim 9, wherein the part configured to rotate the substrate is configured to support a central portion of the back side of the substrate.

11. An apparatus for cleaning a back side of a substrate comprising:
a part configured to rotate the substrate supporting a central portion of the back side of the substrate;
at least one cleaning assembly, the at least one cleaning assembly comprising:
a cleaning solution supply part configured to receive a cleaning solution; and
an ultrasonic wave supply part configured to apply an ultrasonic wave to the cleaning solution such that a column of the cleaning solution is formed from the cleaning solution supply part toward the back side of the substrate with the column of the cleaning solution contacting the back side of the substrate, and the apparatus further comprising:
a positioning part configured to adjust a height of the at least one cleaning assembly such that the column of the cleaning solution contacts the back side of the substrate,
the at least one cleaning assembly comprises a first cleaning assembly and a second cleaning assembly symmetrically disposed under the substrate,
the first cleaning assembly includes
a first ultrasonic wave supply part configured to generate a first ultrasonic wave having a first frequency to remove impurities having a first size from the back side of the substrate, and
the second cleaning assembly includes a second ultrasonic wave supply part configured to generate a second ultrasonic wave having a second frequency to remove impurities having a second size smaller than the first size from the back side of the substrate,
the first frequency is greater than or equal to 200 KHz and less than or equal to 400 KHz, and
the second frequency is greater than or equal to 0.4 MHz and less than or equal to 1.2 MHz.

12. The apparatus of claim 11, wherein the cleaning solution supply part includes a bath and the ultrasonic wave supply part is configured to apply the ultrasonic wave from a bottom of the bath toward a top of the bath.

13. The apparatus of claim 11, wherein
the first cleaning assembly includes a first cleaning solution supply part and the second cleaning assembly includes a second cleaning solution supply part, and
the first ultrasonic wave supply part forms the column of the cleaning solution from the first cleaning solution supply part toward the back side of the substrate and the second ultrasonic wave supply part forms the column of the cleaning solution from the second cleaning solution supply part toward the back side of the substrate.

14. The apparatus of claim 11, wherein the part for rotating the substrate rotates the substrate, the ultrasonic wave supply part generates the ultrasonic wave and the positioning part contacts the column of the cleaning solution with the back side of the substrate when the back side of the substrate is cleaned, and
wherein the ultrasonic wave supply part does not operate and the part for rotating the substrate rotates the substrate when the back side of the substrate is dried.

* * * * *